US012775827B2

(12) United States Patent
Kim et al.

(10) Patent No.: US 12,775,827 B2
(45) Date of Patent: Oct. 27, 2026

(54) NEURAL NETWORK PROCESSING METHOD AND DEVICE THEREFOR

(71) Applicant: FURIOSAAI INC., Seoul (KR)

(72) Inventors: Hanjoon Kim, Hwaseong-si (KR); Joonho Baek, Suwon-si (KR)

(73) Assignee: FURIOSAAI INC., Seoul (KR)

( * ) Notice: Subject to any disclaimer, the term of this patent is extended or adjusted under 35 U.S.C. 154(b) by 999 days.

(21) Appl. No.: 18/008,021

(22) PCT Filed: Jun. 4, 2021

(86) PCT No.: PCT/KR2021/007002
§ 371 (c)(1),
(2) Date: Dec. 2, 2022

(87) PCT Pub. No.: WO2021/246818
PCT Pub. Date: Dec. 9, 2021

(65) Prior Publication Data

US 2023/0229899 A1 Jul. 20, 2023

(30) Foreign Application Priority Data

Jun. 5, 2020 (KR) ........................ 10-2020-0068571

(51) Int. Cl.
*G06N 3/00* (2023.01)
*G06N 3/063* (2023.01)
(Continued)

(52) U.S. Cl.
CPC ............... *G06N 3/063* (2013.01); *G06N 3/08* (2013.01); *G06F 3/06* (2013.01); *G06F 7/00* (2013.01);
(Continued)

(58) Field of Classification Search
None
See application file for complete search history.

(56) References Cited

U.S. PATENT DOCUMENTS 10,049,322 B2 * 8/2018 Ross ...................... G06N 3/063
10,698,730 B2 * 6/2020 Kim ........................ G06F 9/546
(Continued)

FOREIGN PATENT DOCUMENTS

CN 108875920 A 11/2018
KR 10-2019-0062303 A 6/2019
(Continued)

OTHER PUBLICATIONS

International Search Report for PCT/KR2021/007002, dated Sep. 17, 2021.

*Primary Examiner* — Midys Rojas
(74) *Attorney, Agent, or Firm* — Sughrue Mion, PLLC

(57) ABSTRACT

According to an embodiment of the present invention, a device for artificial neural network (ANN) may comprise: memories for read/write (R/W) of data related to an ANN model; and at least one operation unit which performs, based on the data, operations for multiple layers included in the ANN model, wherein the memories include at least one memory-subsystem corresponding to a combination of different types of multiple memories, and each operation unit performs R/W of the data through a memory-subsystem associated with the each operation unit among the at least one memory-subsystem.

17 Claims, 12 Drawing Sheets

(51) Int. Cl.

| | |
|---|---|
| ***G06N 3/08*** | (2023.01) |
| *G06F 3/06* | (2006.01) |
| *G06F 7/00* | (2006.01) |
| *G06F 13/16* | (2006.01) |
| *G06N 3/045* | (2023.01) |
| *G06N 3/0464* | (2023.01) |
| *G06N 3/048* | (2023.01) |
| *G06N 3/09* | (2023.01) |
| *G06N 5/04* | (2023.01) |
| *G06N 20/00* | (2019.01) |
| *G11C 8/00* | (2006.01) |

(52) U.S. Cl.

CPC .............. *G06F 13/16* (2013.01); *G06N 3/045* (2023.01); *G06N 3/0464* (2023.01); *G06N 3/048* (2023.01); *G06N 3/09* (2023.01); *G06N 5/04* (2013.01); *G06N 20/00* (2019.01); *G11C 8/00* (2013.01)

(56) References Cited

U.S. PATENT DOCUMENTS

| | | | | |
|---|---|---|---|---|
| 2018/0189651 | A1 | 7/2018 | Henry et al. | |
| 2018/0307968 | A1 | 10/2018 | Bose et al. | |
| 2022/0351032 | A1* | 11/2022 | Chou | G11C 5/02 |
| 2026/0105309 | A1* | 4/2026 | Wu | G06N 3/063 |

FOREIGN PATENT DOCUMENTS

| | | | |
|---|---|---|---|
| KR | 10-2020-0005361 | A | 1/2020 |
| KR | 10-2020-0045006 | A | 4/2020 |

* cited by examiner

X100

NEURAL NETWORK PROCESSING METHOD AND DEVICE THEREFOR

CROSS REFERENCE TO RELATED APPLICATIONS

This application is a National Stage of International Application No. PCT/KR2021/007002 filed Jun. 4, 2021, claiming priority based on Korean Patent Application No. 10-2020-0068571 filed Jun. 5, 2020.

TECHNICAL FIELD

The present invention relates to a neural network, and more particularly, to an artificial neural network (ANN)-related processing method and a device for performing the same.

BACKGROUND ART

Neurons constituting the human brain form a kind of signal circuit, and a data processing architecture and method that mimic the signal circuit of neurons is called an artificial neural network (ANN). In an ANN, a number of interconnected neurons forms a network, and an input/output process for individual neurons can be mathematically modeled as [Output=f(W1×Input 1+W2×Input 2+ . . . +WN×Input N]). Wi represents a weight, and the weight may have various values depending on the ANN type/model, layers, each neuron, and learning results.

With the recent development of computing technology, a deep neural network (DNN) having a plurality of hidden layers among ANNs is being actively studied in various fields, and deep learning is a training process (e.g., weight adjustment) in a DNN. Inference refers to a process of obtaining an output by inputting new data into a trained neural network (NN) model.

A convolutional neural network (CNN) is one of representative DNNs and may be configured based on a convolutional layer, a pooling layer, a fully connected layer, and/or a combination thereof. The CNN has a structure suitable for learning two-dimensional data and is known to exhibit excellent performance in image classification and detection.

Since massive layers, data, and memory read/write are involved in operations for training or inference of NNs including CNNs, distributed/parallel processing, a memory structure, and control thereof are key factors that determine performance.

DISCLOSURE

Technical Task

A technical task of the present invention is to provide a more efficient neural network processing method and a device therefor.

In addition to the aforementioned technical task, other technical tasks may be inferred from the detailed description.

Technical Solutions

A device for artificial neural network (ANN) processing according to an aspect of the present invention includes memories for read/write (R/W) of data related to an ANN model, and at least one operation unit configured to perform operations regarding a plurality of layers included in the ANN model based on the data. The memories may include at least one memory-subsystem corresponding to a combination of a plurality of memories of different types. Each operation unit may be configured to perform R/W of the data through a memory-subsystem associated with the each operation unit itself among the at least one memory-subsystem.

R/W for weights of a first layer of the ANN model may be performed through a first type memory of the associated memory-subsystem. R/W for weights of a second layer of the ANN model, on which an operation is performed after the first layer, may be performed through a second type memory of the associated memory-subsystem. R/W for weights of a third layer of the ANN model, on which an operation is performed after the second layer, may be performed through a third type memory of the associated memory-subsystem.

A read latency of the second type memory may be longer than a read latency of the first type memory and shorter than a read latency of the third type memory.

A processing time for the first layer may be equal to or longer than the read latency of the second type memory. A sum of the processing time for the first layer and a processing time for the second layer may be equal to or greater than the read latency of the third type memory.

The weights of the second layer may be prefetched from the second type memory during the processing time of the first layer. The weights of the third layer may be prefetched from the third type memory during the processing times of the first layer and the second layer.

Each memory-subsystem may be a combination of an SRAM, a DRAM, and a NAND flash memory.

The SRAM may be coupled to each operation unit in an on-chip form.

The plurality of memories of different types within each memory-subsystem may have a hierarchical memory structure.

A memory at a lowest level in the hierarchical memory structure may store weights for at least two deep neural network (DNN) models trained in advance through deep learning.

A type of a memory to be used for a corresponding layer may be determined based on a result of compiling the ANN model.

The device may be an accelerator configured to perform inference based on a previously trained deep neural network (DNN) model.

The device may be a data center on an Internet protocol (IP) network, configured to respond to inference requests from multiple users via a network interface card (NIC).

An artificial neural network (ANN) processing method according to another aspect of the present invention includes obtaining weights of a first layer among a plurality of layers included in an ANN model from a memory-subsystem corresponding to a combination of a plurality of memories of different types, performing an operation on the first layer based on the obtained weights of the first layer, obtaining weights of a second layer of the ANN model from the memory-subsystem while the operation is performed on the first layer, and obtaining weights of a third layer of the ANN model from the memory-subsystem while the operation on the first layer and the operation on the second layer are performed. The weights of the first layer may be obtained from a first type memory of the memory-subsystem. The weights of the second layer on which the operation is performed after the first layer may be obtained from a second type memory of the memory-subsystem. The weights of the third layer on which the operation is performed after the second layer may be obtained from a third type memory of the memory-subsystem.

A processor-readable recording medium storing instructions for performing the above-described method may be provided according to another aspect of the present invention.

Advantageous Effects

According to an embodiment of the present invention, it is possible to provide a more efficient neural network processing method and device by configuring and controlling different types of memories having a hierarchical structure adaptively to characteristics of neural network operations.

Other technical effects of the present invention can be inferred from the detailed description.

MODE FOR INVENTION

Hereinafter, exemplary embodiments applicable to a method and device for neural network processing will be described. The examples described below are non-limiting examples for aiding in understanding of the present invention described above, and it can be understood by those skilled in the art that combinations/omissions/changes of some embodiments are possible.

Figure 1:
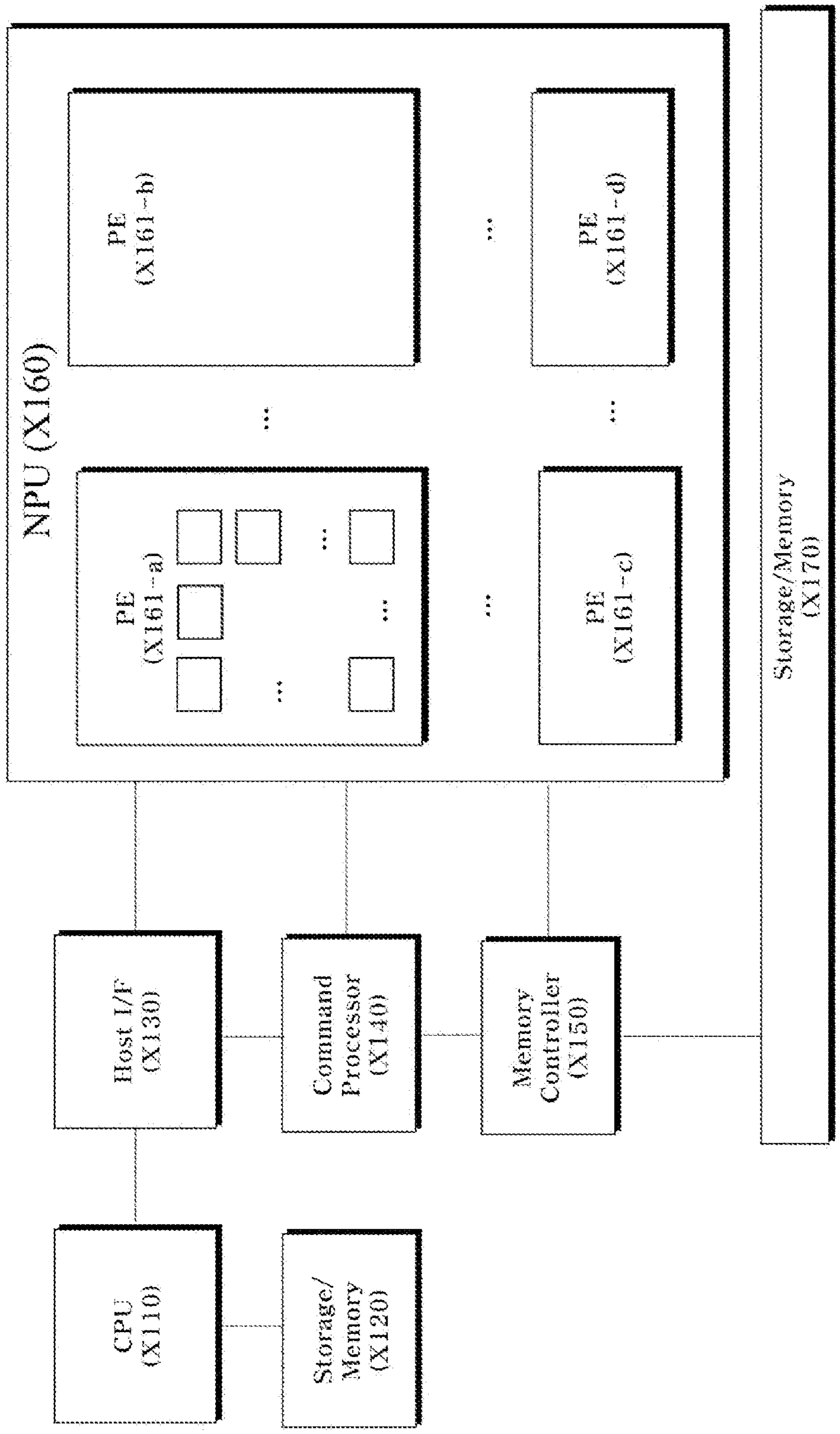
FIG. 1 shows an example of a system according to an embodiment of the present invention.

FIG. 1 shows an example of a system including an operation processing unit (or processor).

Referring to FIG. 1, a neural network processing system X100 according to the present embodiment may include at least one of a central processing unit (CPU) X110 and a neural processing unit (NPU) X160.

The CPU X110 may be configured to perform a host role and function to issue various commands to other components in the system, including the NPU X160. The CPU X110 may be connected to a storage/memory X120 or may have a separate storage provided therein. The CPU X110 may be referred to as a host and the storage X120 connected to the CPU X110 may be referred to as a host memory depending on the functions executed thereby.

The NPU X160 may be configured to receive a command from the CPU X110 to perform a specific function such as an operation. In addition, the NPU X160 includes at least one processing element (PE, or processing engine) X161 configured to perform ANN-related processing. For example, the NPU X160 may include 4 to 4096 PEs X161 but is not necessarily limited thereto. The NPU X160 may include less than 4 or more than 4096 PEs X161.

The NPU X160 may also be connected to a storage X170 and/or may have a separate storage provided therein.

The storages X120 and 170 may be a DRAM/SRAM and/or NAND, or a combination of at least one thereof, but are not limited thereto, and may be implemented in any form as long as they are a type of storage for storing data.

Referring back to FIG. 1, the neural network processing system X100 may further include a host interface (Host I/F) X130, a command processor X140, and a memory controller X150.

The host interface X130 is configured to connect the CPU X110 and the NPU X160 and allows communication between the CPU X110 and the NPU X160 to be performed.

The command processor X140 is configured to receive a command from the CPU X110 through the host interface X130 and transmit it to the NPU X160.

The memory controller X150 is configured to control data transmission and data storage of each of the CPU X110 and the NPU X160 or therebetween. For example, the memory controller X150 may control operation results of the PE X161 to be stored in the storage X170 of the NPU X160.

Specifically, the host interface X130 may include a control/status register. The host interface X130 provides an interface capable of providing status information of the NPU X160 to the CPU X110 and transmitting a command to the command processor X140 using the control/status register. For example, the host interface X130 may generate a PCIe packet for transmitting data to the CPU X110 and transmit the same to a destination or may transmit a packet received from the CPU X110 to a designated place.

The host interface X130 may include a direct memory access (DMA) engine to transmit massive packets without intervention of the CPU X110. In addition, the host interface X130 may read a large amount of data from the storage X120 or transmit data to the storage X120 at the request of the command processor X140.

Further, the host interface X130 may include a control/status register accessible through a PCIe interface. In a system booting process according to the present embodiment, physical addresses of the system (PCIe enumeration) are allocated to the host interface X130. The host interface X130 may read or write to the space of a register by executing functions such as loading and storing in the control/status register through some of the allocated physical addresses. State information of the host interface X130, the command processor X140, the memory controller X150, and the NPU X160 may be stored in registers of the host interface X130.

Although the memory controller X150 is positioned between the CPU X110 and the NPU X160 in FIG. 1, this is not necessarily limited thereto. For example, the CPU X110 and the NPU X160 may have different memory controllers or may be connected to separate memory controllers.

In the above-described neural network processing system X100, a specific operation such as image determination may be described in software and stored in the storage X120 and may be executed by the CPU X110. The CPU X110 may load weights of a neural network from a separate storage device (HDD, SSD, etc.) to the storage X120 in a process of executing a program, and load the same to the storage X170 of the NPU X160. Similarly, the CPU X110 may read image data from a separate storage device, load the same to the storage X120, perform some conversion processes, and then store the same in the storage X170 of the NPU X160.

Thereafter, the CPU X110 may instruct the NPU X160 to read the weights and the image data from the storage X170 of the NPU X160 and perform an inference process of deep learning. Each PE X161 of the NPU X160 may perform processing according to an instruction of the CPU X110. After the inference process is completed, the result may be stored in the storage X170. The CPU X110 may instruct the command processor X140 to transmit the result from the storage X170 to the storage X120 and finally transmit the result to software used by the user.

Figure 2:
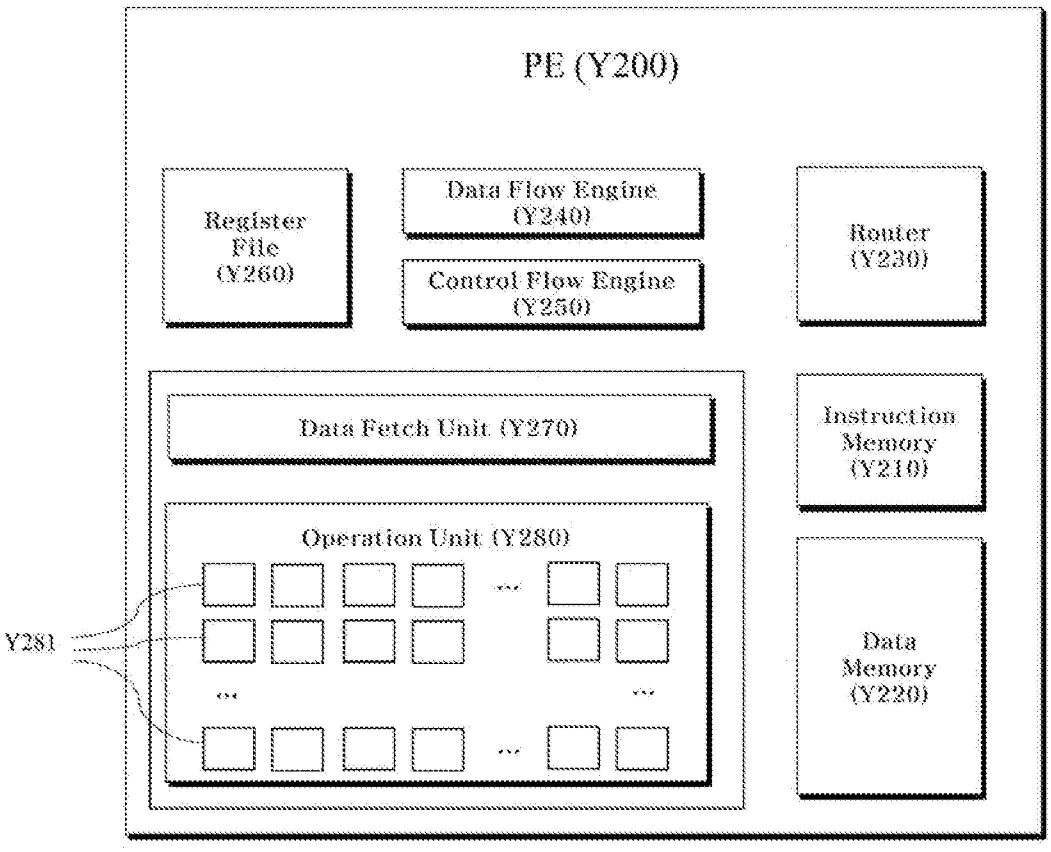
FIG. 2 shows an example of a PE according to an embodiment of the present invention.

FIG. 2 shows an example of a detailed configuration of a PE.

Referring to FIG. 2, a PE Y200 according to the present embodiment may include at least one of an instruction memory Y210, a data memory Y220, a data flow engine Y240, a control flow engine 250 or an operation unit Y280. In addition, the PE Y200 may further include a router Y230, a register file Y260, and/or a data fetch unit Y270.

The instruction memory Y210 is configured to store one or more tasks. A task may be composed of one or more instructions. An instruction may be code in the form of an instruction but is not necessarily limited thereto. Instructions may be stored in a storage associated with the NPU, a storage provided inside the NPU, and a storage associated with the CPU.

The task described in this specification means an execution unit of a program executed in the PE Y200, and the instruction is an element formed in the form of a computer instruction and constituting a task. One node in an artificial neural network performs a complex operation such as f(Σ wi×xi), and this operation can be performed by being divided by several tasks. For example, all operations performed by one node in an artificial neural network may be performed through one task, or operations performed by multiple nodes in an artificial neural network may be performed through one task. Further, commands for performing operations as described above may be configured as instructions.

For convenience of understanding, a case in which a task is composed of a plurality of instructions and each instruction is composed of code in the form of a computer instruction is taken as an example. In this example, the data flow engine Y240 described below checks completion of data preparation of tasks for which data necessary for each execution is prepared. Thereafter, the data flow engine 240 transmits task indexes to a fetch ready queue in the order in which data preparation is completed (starts execution of the tasks) and sequentially transmits the task indexes to the fetch ready queue, a fetch block, and a running ready queue. In addition, a program counter Y252 of the control flow engine Y250 described below sequentially executes a plurality of instructions included in the tasks to analyze the code of each instruction, and thus the operation in the operation unit Y280 is performed. In this specification, such processes are represented as "executing a task." In addition, the data flow engine Y240 performs procedures such as "checking data," "loading data," "instructing the control flow engine to execute a task," "starting execution of a task," and "performing task execution," and processes according to the control flow engine Y250 are represented as "controlling execution of tasks" or "executing task instructions." In addition, a mathematical operation according to the code analyzed by the program counter 252 may be performed by the following operation unit Y280, and the operation performed by the operation unit Y280 is referred to herein as "operation." The operation unit Y280 may perform, for example, a tensor operation. The operation unit Y280 may also be referred to as a functional unit (FU).

The data memory Y220 is configured to store data associated with tasks. Here, the data associated with the tasks may be input data, output data, weights, or activations used for execution of the tasks or operation according to execution of the tasks, but is not necessarily limited thereto.

The router Y230 is configured to perform communication between components constituting the neural network processing system and serves as a relay between the components constituting the neural network processing system. For example, the router Y230 may relay communication between PEs or between the command processor Y140 and the memory controller Y150. The router Y230 may be provided in the PE Y200 in the form of a network on chip (NOC).

The data flow engine Y240 is configured to check whether data is prepared for tasks, load data necessary to execute the tasks in the order of the tasks for which the data preparation is completed, and instruct the control flow engine Y250 to execute the tasks. The control flow engine Y250 is configured to control execution of the tasks in the order instructed by the data flow engine Y240. Further, the control flow engine Y250 may perform calculations such as addition, subtraction, multiplication, and division that occur as the instructions of tasks are executed.

The register file Y260 is a storage space frequently used by the PE Y200 and includes one or more registers used in the process of executing code by the PE Y200. For example, the register file 260 may be configured to include one or more registers that are storage spaces used as the data flow engine Y240 executes tasks and the control flow engine Y250 executes instructions.

The data fetch unit Y270 is configured to fetch operation target data according to one or more instructions executed by the control flow engine Y250 from the data memory Y220 to the operation unit Y280. Further, the data fetch unit Y270 may fetch the same or different operation target data to a plurality of operators Y281 included in the operation unit Y280.

The operation unit Y280 is configured to perform operations according to one or more instructions executed by the control flow engine Y250 and is configured to include one or more operators Y281 that perform actual operations. The operators Y281 are configured to perform mathematical operations such as addition, subtraction, multiplication, and multiply-and-accumulate (MAC). The operation unit Y280 may be of a form in which the operators Y281 are provided at a specific unit interval or in a specific pattern. When the operators Y281 are formed in an array form in this manner, the operators Y281 of an array type can perform operations in parallel to process operations such as complex matrix operations at once.

Although the operation unit Y280 is illustrated in a form separate from the control flow engine Y250 in FIG. 2, the PE Y200 may be implemented in a form in which the operation unit Y280 is included in the control flow engine Y250.

Result data according to an operation of the operation unit Y280 may be stored in the data memory Y220 by the control flow engine Y250. Here, the result data stored in the data memory Y220 may be used for processing of a PE different from the PE including the data memory. For example, result data according to an operation of the operation unit of a first PE may be stored in the data memory of the first PE, and the result data stored in the data memory of the first PE may be used in a second PE.

A data processing device and method in an artificial neural network and a computing device and method in an artificial neural network may be implemented by using the above-described neural network processing system and the PE Y200 included therein.

Heterogeneous Memory Structure for ANN Processing

According to an embodiment of the present invention, different types of memories may be used together for ANN processing, thereby enabling more cost-effective ANN processing. For example, the proposed heterogeneous memory structure can be used in an ANN processing device such as an inference accelerator (e.g., a large-capacity memory deep learning inference accelerator), and the cost can be reduced while maintaining the performance of the ANN processing device through the heterogeneous memory structure. A deep learning inference accelerator may refer to an accelerator that performs inference using a model trained through deep learning. A deep learning inference accelerator may be referred to as a deep learning accelerator, an inference accelerator, or an accelerator for short.

Although the heterogeneous memory structure will be described focusing on the inference accelerator for convenience, the inference accelerator is merely a form of a neural processing unit (NPU) to which the heterogeneous memory structure of the present invention is applicable or an ANN processing device including the NPU, and application of the present invention is not limited to inference accelerators. For example, the heterogeneous memory structure may be used in an NPU processor for learning/training.

In general, the same type of memory is mainly used for processing. For example, it is common that a memory structure is composed of the same type of memories such as only DDR dynamic random access memories (DRAMs) or only high bandwidth memories (HBAs).

Memory types have different characteristics. Briefly, types of widely used memories are as follows. (i) DRAM is more expensive than NAND and has limited capacity. It exhibits lower latency than NAND and higher latency than SRAM. (ii) NAND has the advantage of having a relatively high storage capacity at a low cost compared to SRAM or DRAM, whereas NAND has higher latency than SRAM or DRAM. Further, since NAND cannot be updated in-place, a write process is relatively complicated. That is, since data overwriting is not supported in NAND, new data can be written only when previously stored data is deleted. Therefore, compared to other memories that update data through overwriting, NAND has a disadvantage of having a complicated write process and a considerable time delay.

For inference of a deep learning accelerator, a model (e.g., a model trained through deep learning, simply "deep learning model" or "model") needs to be transferred/loaded into the accelerator/accelerator memory. Depending on the usage environment and purpose of the accelerator, the accelerator may need to support various deep learning models. For example, in a situation where there are various deep learning models requested by many users while the memory capacity of the accelerator is limited, model transfer and change to the accelerator/memory may occur frequently according to requests of the users. As a more specific example, a model for a user requesting an audio-related service and a model for a user requesting an image-related service may be different from each other, and the accelerator may need to change loaded models in order to provide the services through a model suitable for the request of each user.

According to an embodiment of the present invention, a hybrid structure of different types of memories may be used as a memory structure of the inference accelerator. As an example, a hybrid structure of DRAM+NAND (instead of DRAM only) may be used as the memory structure of the inference accelerator.

Inference processing based on a deep learning model has characteristics that the number of reads is considerably greater than the number of writes. For example, a deep learning model written once to the memory of the accelerator can be read multiple times for inference processing (i.e., write-once and read-many access structure).

A NAND read time has a longer latency than a DRAM or SRAM read time but is generally much shorter than an inference processing time based on a deep learning model. Although a total processing time for inference may vary depending on the model and data size, it generally requires a sufficiently longer time than the NAND read latency. For example, the total processing time for inference may be several hundred μs to several tens of ms, whereas the NAND read latency may be about 10 to 40 μs.

Further, some deep learning inference accelerators may have execution times predictable by a compiler. In this case, inference accelerators may estimate processing time through the compiler before starting actual operations.

According to an embodiment of the present invention, even if a NAND having a relatively large latency is used, performance degradation of the inference accelerator or increase in processing time can be prevented or minimized. As an example, a method of allowing an inference accelerator based on a hybrid structure of DRAM+NAND (using an estimate of the processing time of the inference accelerator) to have performance comparable to that of an inference accelerator based on a DRAM-only structure is newly proposed.

As a specific example, at least some of weights defining a deep learning model may be written to the NAND of the inference accelerator. In the process of estimating the processing time, a deep learning compiler can ascertain in advance when the corresponding weights are required (e.g., timing when an operation based on the weights is actually performed in a PE). Therefore, the deep learning compiler can request an operation (e.g., instruct the NAND to read the weights) a time corresponding to a NAND read latency before a time when the weights written to the NAND are required for the operation such that the weights can be transmitted to the PE without performance deterioration even though the NAND read latency is considerably greater than DRAM latency.

Since the NAND is non-volatile and has larger capacity than the DRAM, many models can be stored in the NAND of the inference accelerator. If various models are stored in the inference accelerator as described above, inference processing can be smoothly performed even if inference requests for other models occur simultaneously. The inference accelerator can read a model requested by a user from the NAND of the inference accelerator without having to additionally access an external device (such as an IP network) to obtain the model, and thus can perform processing more rapidly and smoothly.

As a result, it is possible to reduce the cost without degrading the performance of the inference accelerator and to execute deep learning inference while reducing network access through the hybrid structure of heterogeneous memories.

Heterogeneous memories of the inference accelerator according to an embodiment of the present invention may have a hierarchical structure.

Figure 3:
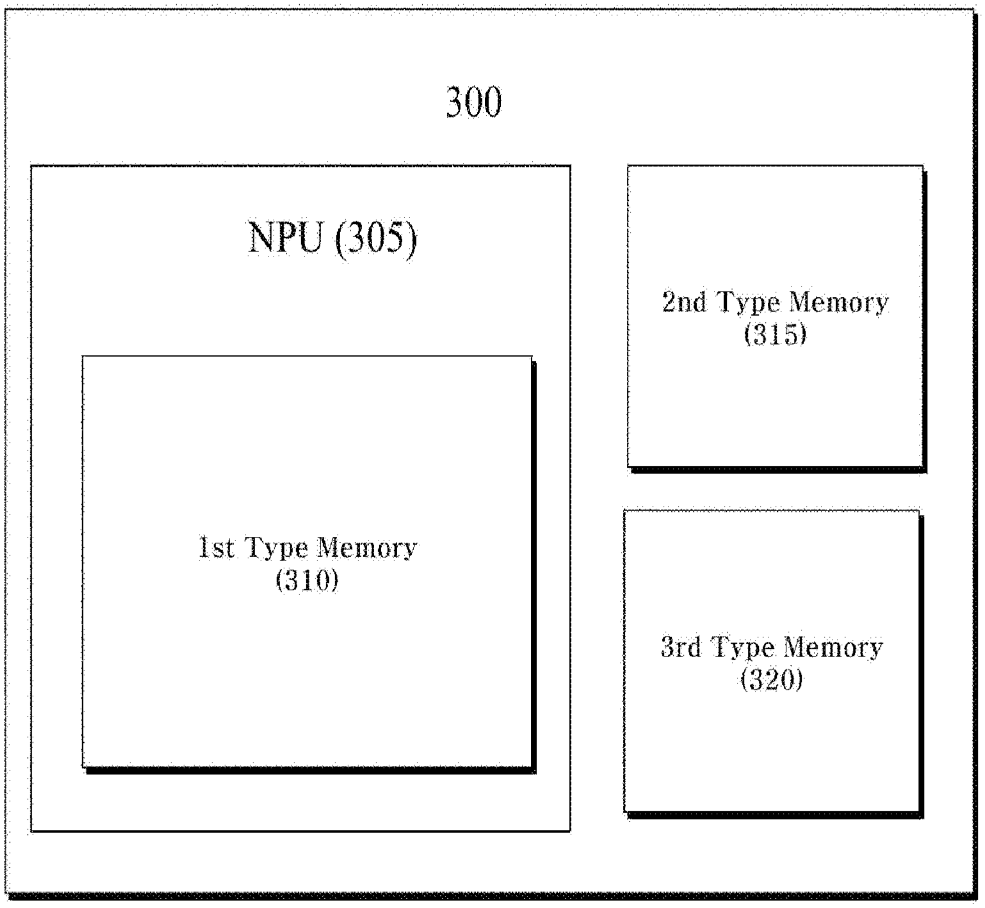
FIG. 3 illustrates an NPU and a memory subsystem according to an embodiment of the present invention.

FIG. 3 illustrates an NPU and a memory subsystem according to an embodiment of the present invention. Referring to FIG. 3, a first type memory 310 may be provided in an on-chip form in an NPU 305 of a processing device 300. In addition, the processing apparatus 300 may additionally include at least one type of memory different from the first type. In FIG. 3, it is assumed that the processing device 300 includes a second type memory 315 and a third type memory 320 in addition to the first type memory 310. The first type memory may have the lowest latency for read and/or write and the third type memory may have the highest latency for read and/or write. The first type memory, the second type memory, and the third type memory may have a hierarchical memory structure.

For convenience of description, it is assumed that the first type memory is an SRAM, the second type memory is a DRAM, and the third type memory is a NAND.

For inference, the following cost-effective hierarchical memory structure may be used.

(a) SRAM: A large SRAM can be mounted to maximize the efficiency of modern compact models.

(b) +DRAM+NAND: This can be used to maximize cost effectiveness without deteriorating performance. Deterministic execution makes it possible to schedule precise prefetches from +DRAM+NAND.

(c) NAND: NAND can be used for model storage. For example, NAND may be used for storage of persistent inference models.

Figure 4A:
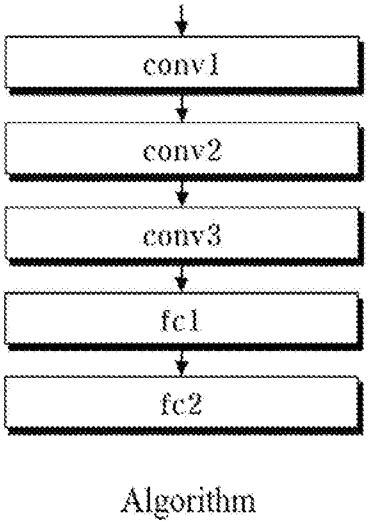
FIGS. 4(*a*) and 4(*b*) show an example of operations that can be performed by a processing device according to an embodiment of the present invention.
Figure 4B:
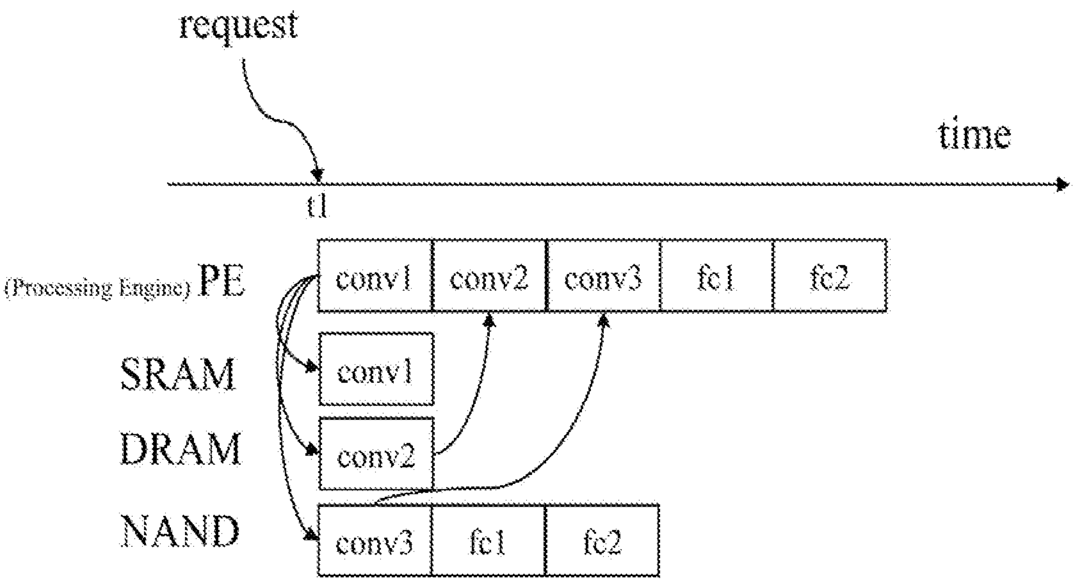

FIGS. 4(*a*) and 4(*b*) show an example of operations that can be performed in the processing device 300 having the memory structure shown in FIG. 3.

Although a deep learning algorithm includes a very large number of layers, it is briefly illustrated in FIGS. 4(*a*) and 4(*b*). In FIG. 4(*a*), it is assumed that an algorithm of an inference model performs operations in the order of a first convolutional layer Conv1, a second convolutional layer Conv2, a third convolutional layer Conv3, a first fully connected layer fc1, and a second fully connected layer fc2.

In addition, it is assumed that Conv1 processing time in a PE is longer than DRAM read latency and Conv1+Conv2 processing time is equal to or longer than NAND read latency (e.g., it is assumed that the processing time is predicted by the compiler of the processing device in this manner).

Referring to FIG. 4(*b*), even if Conv2-related data is stored in a DRAM rather than an SRAM, it does not cause performance degradation. If reading of the Conv2-related data from the DRAM is requested at a time t1, reading from the DRAM may be completed before the PE starts processing of Conv2. Similarly, even if data related to Conv3, fc1, and fc2 is stored in a NAND rather than the SRAM or DRAM, reading may be completed before processing of the corresponding layer starts.

Data that does not cause performance and throughput degradation even when stored in a lower-layer memory relatively slower than an upper-layer memory is advantageous in cost-effectiveness to be stored in a lower-layer memory than in an upper-layer memory.

In the simplest example that does not consider bandwidth restrictions, the PE requests Conv1-related data (e.g., weights) from the SRAM at the time t1 and simultaneously (e.g., within the same cycle or within a certain cycle) requests Conv2-related data (e.g., weights) from the DRAM and Conv3-related data (e.g., weights) from the NAND. While the PE receives Conv1 related data from the SRAM and performs Conv1 processing, reading of the Conv2 related data from the DRAM is performed. Accordingly, the PE can start Conv2 processing (without unnecessary idling) immediately after completion of Conv1 processing. Reading of the Conv3-related data from the NAND is performed while the PE performs Conv1 processing and Conv2 processing. The PE may start Conv3 processing (without unnecessary idling) immediately after completion of Conv2 processing. Similarly, preparation of fc1-related data may be completed before Conv3 processing is completed, and preparation of fc2-related data may be completed before fc1 processing is completed.

As described above, the algorithm of the model obtained through deep learning includes a plurality of computation layers, and for operation of each layer, data such as weights need to be stored in a memory. Stored data should be read at an appropriate time. According to an embodiment of the present invention, a memory layer/type in which data is to be stored may be determined according to the operation order of the corresponding layer and the timing at which the operation is started.

As an example, data may be preferentially stored in an upper-layer memory, and remaining data that cannot be stored in the upper layer may be stored in a lower-layer memory. For example, if all data cannot be stored in an SRAM, the remaining data may be stored in a DRAM and a NAND. Among the remaining data, data related to layer A on which an operation is to be performed first may be stored in the DRAM, and data related to layer B on which an operation will be performed later may be stored in the NAND. When performing inference processing according to a user request, the processing device may request the data related to layer B in advance in consideration of read latency while processing layer A. Thereafter, when the data related to layer B arrives, processing of layer B can be performed.

Figure 5:
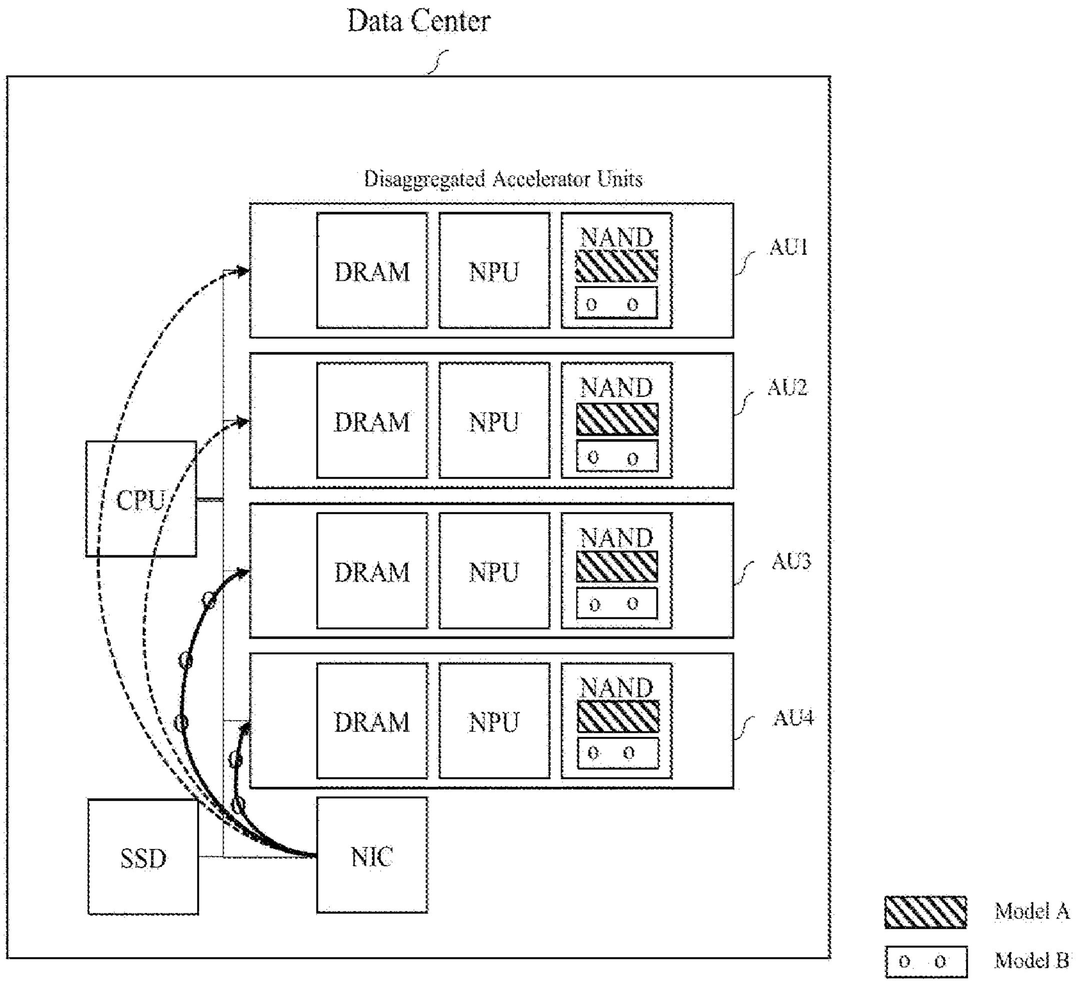
FIG. 5 shows an example of a device (e.g., data center) for performing inference processing according to an embodiment of the present invention.
Figure 6A:
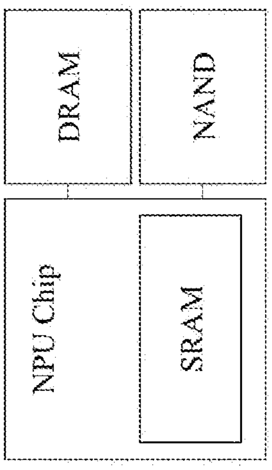
FIGS. 6(*a*)-(6*e*) illustrate memory structures of the device for performing inference processing according to an embodiment of the present invention.
Figure 6B:
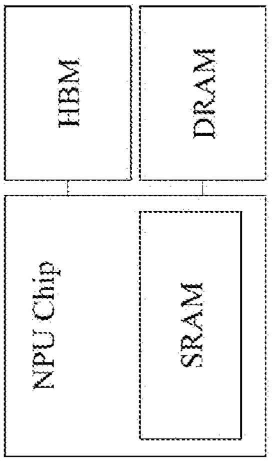
Figure 6C:
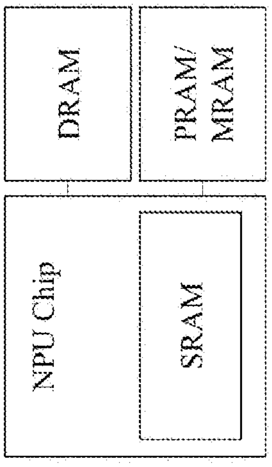
Figure 6D:
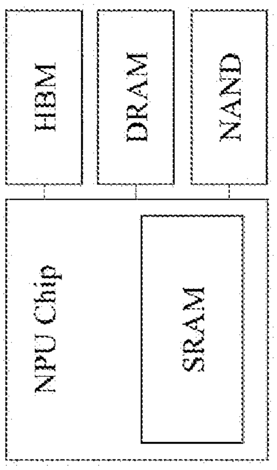
Figure 6E:
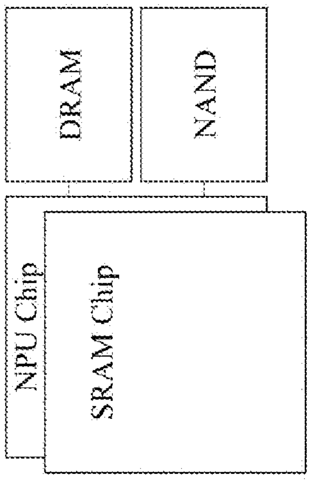

FIG. 5 shows an example of a device (e.g., a data center) for performing inference processing according to an embodiment of the present invention.

As described above, various inference requests (e.g., vision, natural language understanding, NLU, etc.) may coexist in a network server/data center at the same time. Further, the volume of requests received at the data center is time-varying. If the memory structure as described above (e.g., storage of multiple models in NANDs) is applied to the data center, the NPU of the data center can immediately start operations in response to inference request without accessing a solid state drive (SSD) or a network interface card (NIC).

In addition, through this, it is possible to maximize utilization of the NPU in an environment where various combinations of inference requests coexist. A scalable inference method that minimizes bandwidth overhead through disaggregated accelerator units (AUs) may be provided.

In FIGS. 5, AU1 to AU4 may perform inference processing independent of each other in a disaggregated state or may perform inference processing together in a state in which some AUs are aggregated. For example, AU1 and AU2 may perform inference processing based on model A according to a user's request received from the NIC, respectively or in an aggregated state. AU3 and AU4 may perform inference processing based on model B respectively or in an aggregated state according to another user's request received from the NIC. Each AU may read data such as weights for the model required therefor from the corresponding NAND without having to access the SSD or the NIC.

FIGS. 6(*a*)-6(*e*) illustrate memory structures of a device for performing inference processing according to an embodiment of the present invention. Although it is assumed that the device for performing inference processing includes the first type memory, the second type memory, and the third type memory, the first type memory is an SRAM, the second type memory is a DRAM, and the third type memory is a NAND (e.g., FIG. 6(*a*)) in the examples described above with reference to FIG. 3 and the like, the present invention is not limited thereto, and the types and number of memories may be changed. For example, phase-change RAM (PRAM) and/or magnetoresistance RAM (MRAM) may be used as shown in FIG. 6(*c*). A memory hierarchical structure of SRAM/HBM/DRAM/NAND may also be used as shown in FIG. 6(*d*). Comparing FIG. 6(*e*) with FIG. 6(*a*), an SRAM chip is additionally stacked on an NPU chip, which may be used as remote SRAM in FIG. 6(*e*). In other words, FIG. 6(*e*) may be understood as a local SRAM/remote SRAM/DRAM/NAND hierarchical memory structure.

A DNN model used for inference can also be changed in various ways (e.g., VGG-19, ResNet-152, LeNET, etc.).

Although data to be read/written for inference processing may include weights (or model parameters) of a corresponding model, the present invention is not limited thereto. Although a learning/training process entails multiple writing operations because weights of a model are continuously updated in the learning/training process, weights of a model are used for read-only after being written once in the interference process. Data in inference processing may additionally include input activation (or initial input value), intermediate activation (or intermediate input/output value), and output activation (or final output value).

As an example, a process of performing operations of a 5×5 convolutional layer and a 2×2 max pooling layer is described with reference to an example of processing of a LeNet model of FIG. 7. When Input Activation is input, the 5×5 convolutional layer performs a convolution operation using weights (parameters) and outputs first intermediate activation. The 2×2 max pooling layer receives the first intermediate activation and outputs second intermediate activation.

Figure 7:
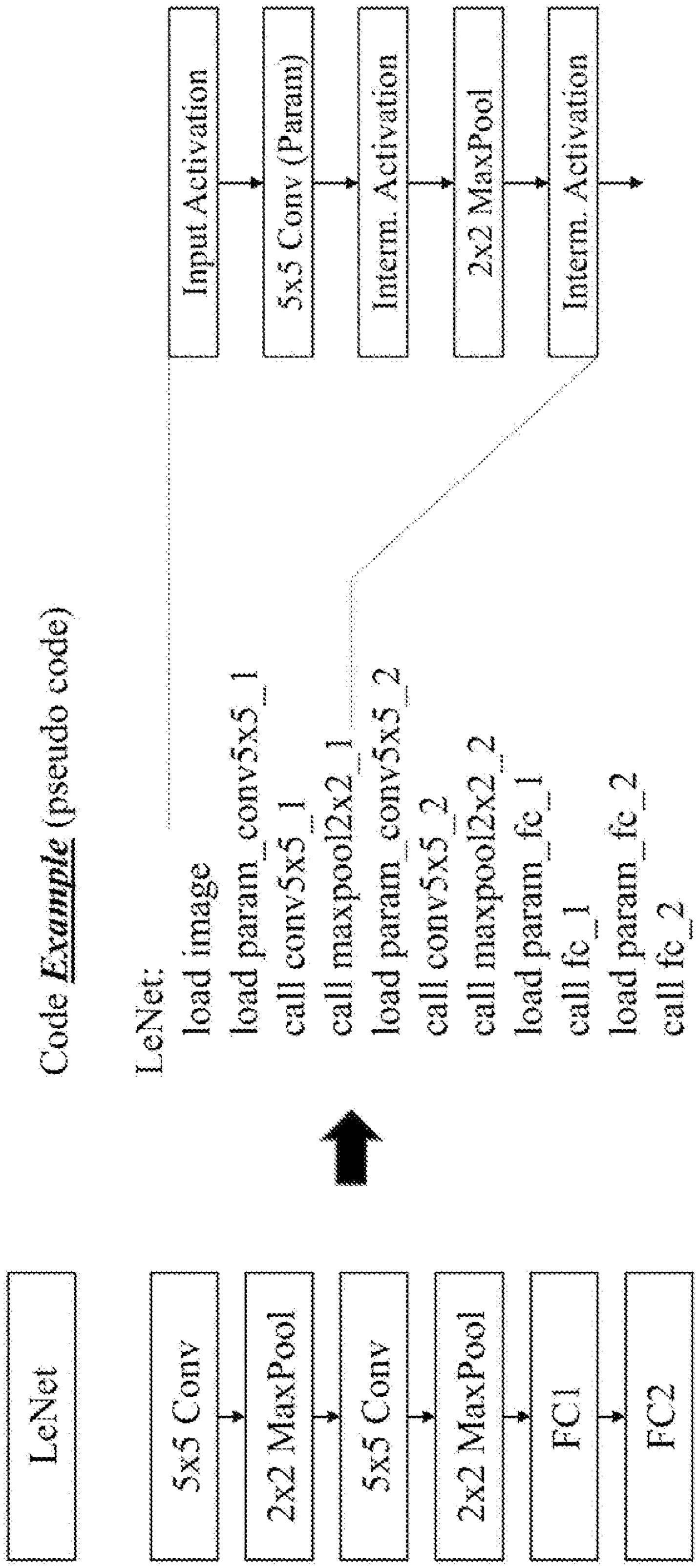
FIG. 7 shows an example of processing of an ANN model.
Figure 8:
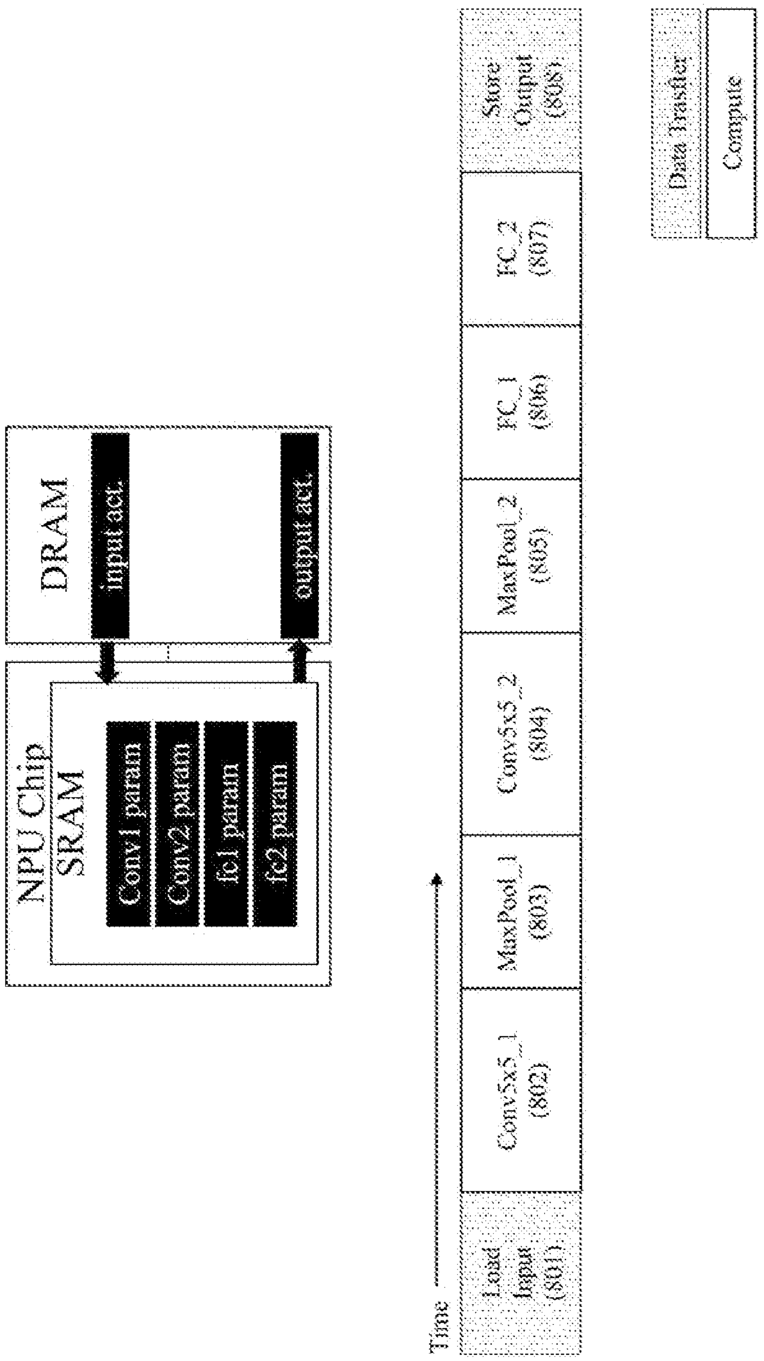
FIGS. 8 to 10 are diagrams for comparing processing performances of various memory structures.
Figures 9A, 9B:
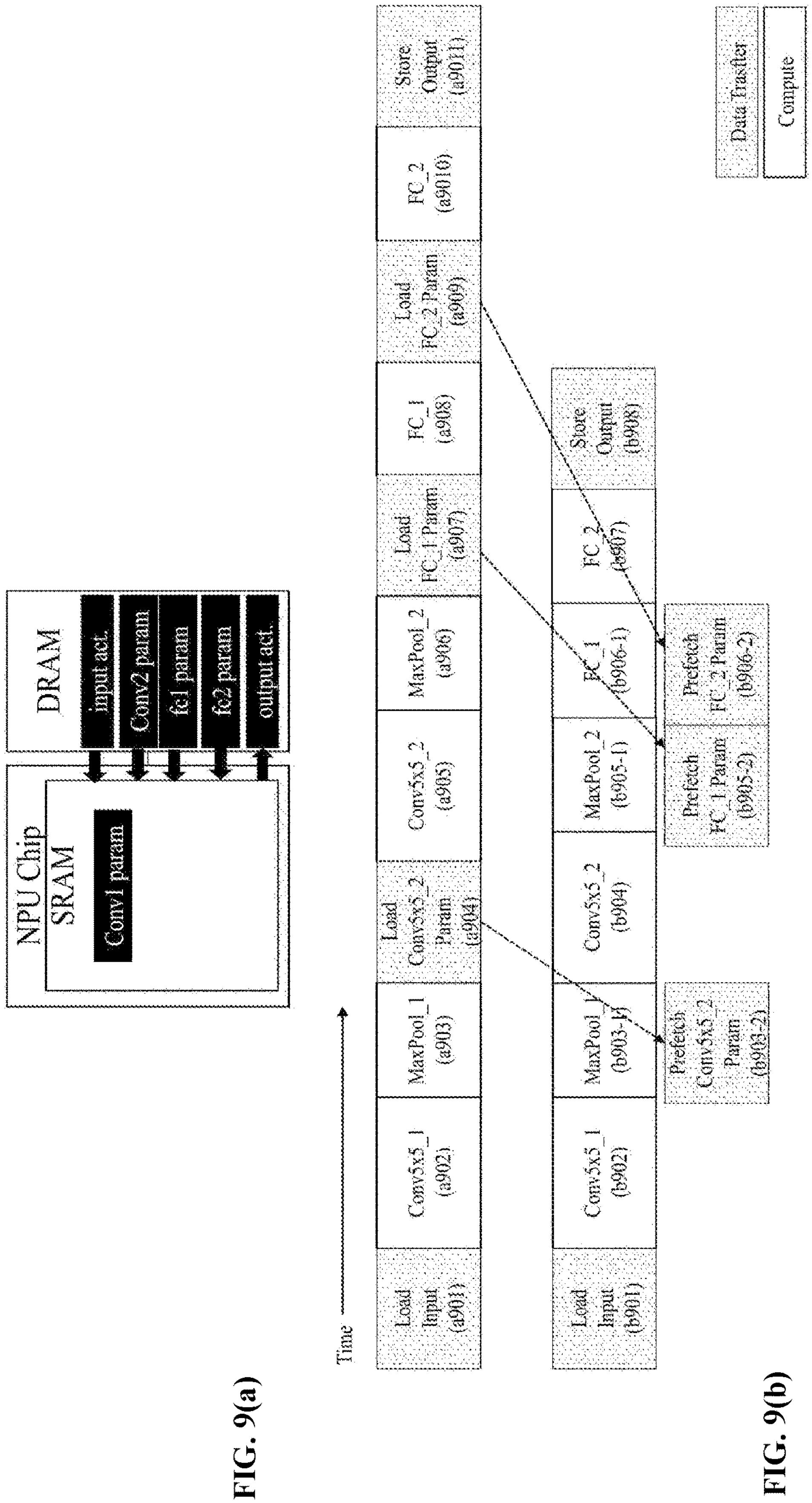
Figure 10:
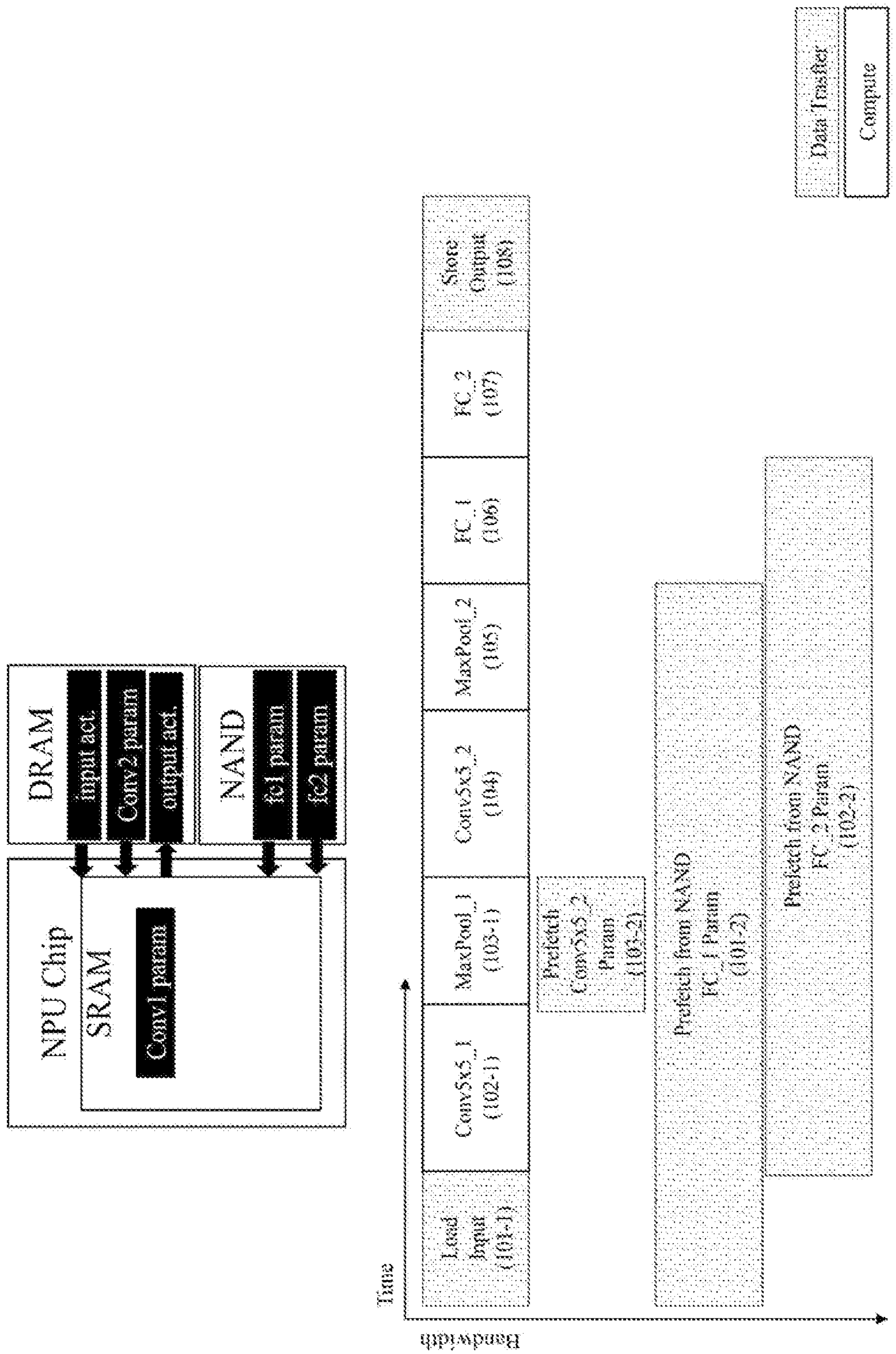

FIGS. 8 to 10 are diagrams for comparing processing performances of processing devices having different memory structures when the processing devices perform the same processing as shown in FIG. 7.

In FIGS. 8, 9(*a*) and 9(*b*), a processing device has an SRAM+DRAM memory structure, and a processing device in FIG. 10 has an SRAM+DRAM+NAND memory structure. In FIG. 8, it is assumed that all parameters (weights) of a model can be stored in the SRAM. In FIGS. 9(*a*) and 9(*b*), it is assumed that only some parameters (weights) of the model are stored in the SRAM and the rest are stored in the DRAM. FIG. 9(*a*) shows a case in which data prefetch is not applied and FIG. 9(*b*) shows a case in which data prefetch is applied. In FIG. 10, some parameters of the model are stored in the SRAM, some are stored in the DRAM, and some are stored in the NAND.

First, referring to FIG. 8, if all model parameters can be stored in the SRAM (e.g., when the SRAM has a sufficient capacity), the processing device may operate as follows.

(801) Transfer input activation from the DRAM to the SRAM (802) Perform Conv1 using input activation and Conv1 parameters (803) Execute MaxPool1 on activation as a result of performing Conv1

(804) Perform Conv2 using activation and Conv2 parameters as a result of performing MaxPool1

(805) Execute MaxPool2 on activation as a result of performing Conv2

(806) Perform FC1 using PC1 parameters on activation as a result of performing MaxPool2

(807) Perform FC2 using PC2 parameters on activation as a result of performing FC1

(808) Transfer a result of performing FC2 from the SRAM to the DRAM

Meanwhile, depending on the implementation, data transfer in (801) and (808) may be performed in such a manner that the data is directly input/output to/from the SRAM (NPU) through a separate I/O such as PCIe without passing through the DRAM.

Referring to FIG. 9(*a*), when all model parameters cannot be stored in the SRAM (e.g., some model parameters may be stored in the SRAM or all model parameters may be stored in the DRAM), the processing device may operate as follows.

(a901) Transfer input activation from the DRAM to the SRAM (a902) Perform Conv1 using the input activation and Conv1 parameters (a903) Execute MaxPool1 on activation as a result of performing Conv1

(a904) Transfer Conv2 parameters from the DRAM to the SRAM (a905) Perform Conv2 using activation as a result of execution of MaxPool1 and the Conv2 parameters (a906) Execute MaxPool2 on activation as a result of performing Conv2

(a907) Transfer FC1 parameters from the DRAM to the SRAM (a908) Perform FC1 using FC1 parameters on activation as a result of execution of MaxPool2

(a909) Transfer FC2 parameters from the DRAM to the SRAM (a9010) Perform FC2 using FC2 parameters on activation as a result of performing FC1

(a9011) Transfer activation as a result of performing FC2 from the SRAM to the DRAM When Prefetch is applied as shown in FIG. 9(*b*), the processing device may operate as follows.

(b901) Transfer input activation from the DRAM to the SRAM (b902) Perform Conv1 using the input activation and Conv1 parameters (b903-1) Execute MaxPool1 on activation as a result of performing Conv1

(b903-2) Prefetch Conv2 parameters from the DRAM to the SRAM (b904) Perform Conv2 using activation as a result of execution of MaxPool1 and the Conv2 parameters (b905-1) Execute MaxPool2 on activation as a result of performing Conv2

(b905-2) Prefetch FC1 parameters from the DRAM to the SRAM (b906-1) Perform FC1 using the FC1 parameters on activation as a result of execution of MaxPool2

(b906-2) Prefetch FC2 parameters from the DRAM to the SRAM (b907) Perform FC2 using the FC2 parameters on activation as a result of performing FC1

(b908) Transfer activation as a result of performing FC2 from the SRAM to the DRAM Next, referring to FIG. 10, input activation/intermediate activation/output activation may be stored in the DRAM.

The model parameters may be stored according to the following rules.

Figure 11:
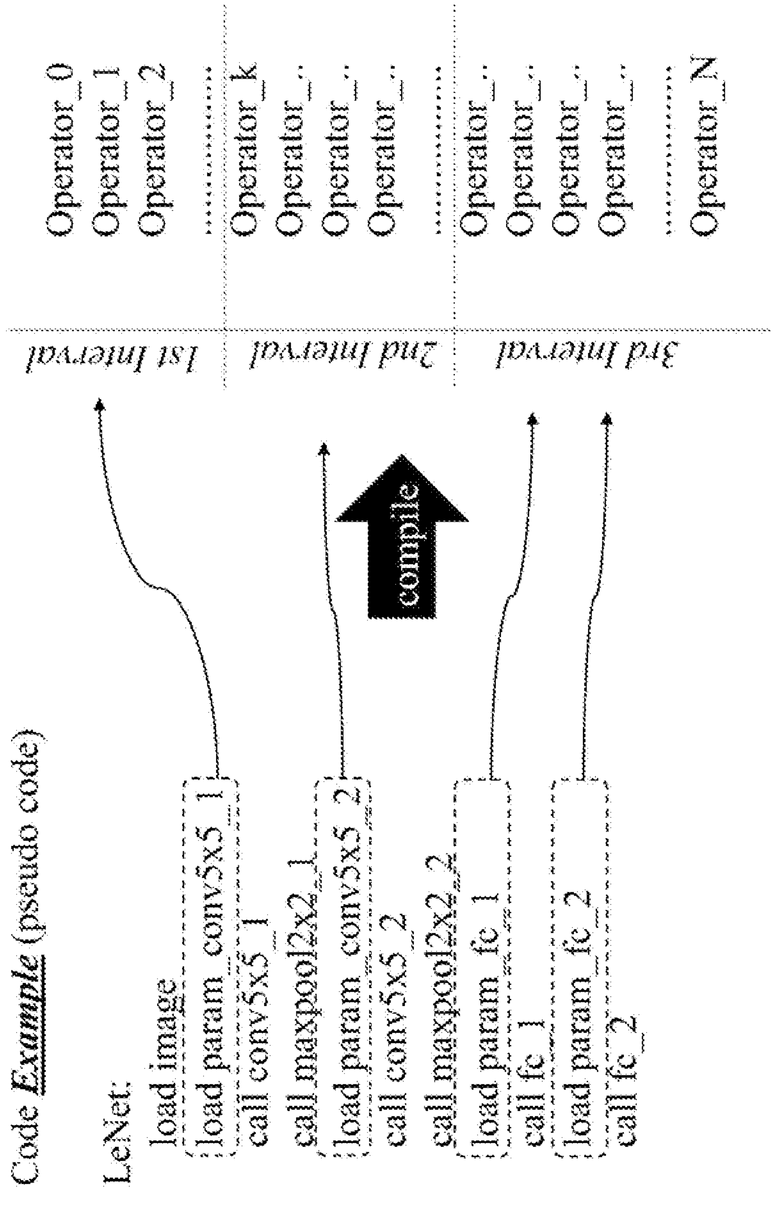
FIG. 11 is a diagram for describing a storage rule for ANN model parameters (weights) according to an embodiment of the present invention.

First, it is assumed that the model is compiled and executed in the order of operator_0, operator_1, operator_2, . . . , operator_N (e.g., FIG. 11).

The model parameters may be classified into three intervals. These are assumed to be a first interval, a second interval, and a third interval in chronological order.

(i) The model parameters of the first interval are stored in the SRAM.

If operator_i satisfies the following condition, operators prior to operator_i may be defined as the first interval.

Execution time of operator_0 to operator_(i−1)<DRAM-to-SRAM transfer time of parameters of operator_i (ii) The model parameters of the third section are stored in NAND.

If operator_i satisfies the following condition, operators after operator_i may be defined as the third interval.

Execution time of operator_0 to operator_(i−1)>NAND-to-SRAM transfer time of parameters of operator_i (iii) The model parameters of the second interval are stored in the DRAM.

Operators positioned between the first interval and the third interval may correspond to the second interval.

Exceptions to the above-described rules (i) to (iii) may be further defined according to implementation. For example, if a parameter that corresponds to the third interval but does not satisfy a prefetch bandwidth acceptable in the third interval is present, this parameter may be stored in the DRAM to utilize the bandwidth of DRAM+NAND. For example, if the maximum bandwidth that can be prefetched from the NAND is exceeded in the third interval, but the bandwidth of DRAM+NAND is not exceeded, the corresponding parameter may be stored in the DRAM instead of the NAND. Alternatively, if there is extra space in the SRAM, SRAM+DRAM+NAND may be used. For example, at least some parameters of the third interval may be stored in the SRAM.

In FIG. 10, the processing apparatus may operate as follows.

(101-1) Transfer input activation from the DRAM to the SRAM (101-2) Request (prefetch) FC1 parameters from the NAND (102-1) Perform Conv1 using the input activation and Conv1 parameters (102-2) Request (prefetch) FC2 parameters from the NAND (103-1) Execute MaxPool1 on activation as a result of performing Conv1

(103-2) Prefetch Conv2 parameters from the DRAM to the SRAM (104) Perform Conv2 using activation as a result of execution of MaxPool1 and the Conv2 parameters.

(105) Execute MaxPool2 on activation as a result of performing Conv2

(106) Perform FC1 using FC1 parameters on activation as a result of execution of MaxPool2

(107) Perform FC2 using FC2 parameters on activation as a result of performing FC1

(108) Transfer activation as a result of performing FC2 from the SRAM to the DRAM Referring to FIGS. 8, 9, and 10, it can be ascertained that the memory structure of FIG. 10 has the same processing time as that in the case of FIG. 8 in which all parameters are stored in the SRAM because the SRAM has a sufficient capacity although the NAND is used. In addition, if cost-effectiveness is further considered, it can be ascertained that the structure of FIG. 10 is most advantageous among the structures of FIGS. 8 to 10.

Figure 12:
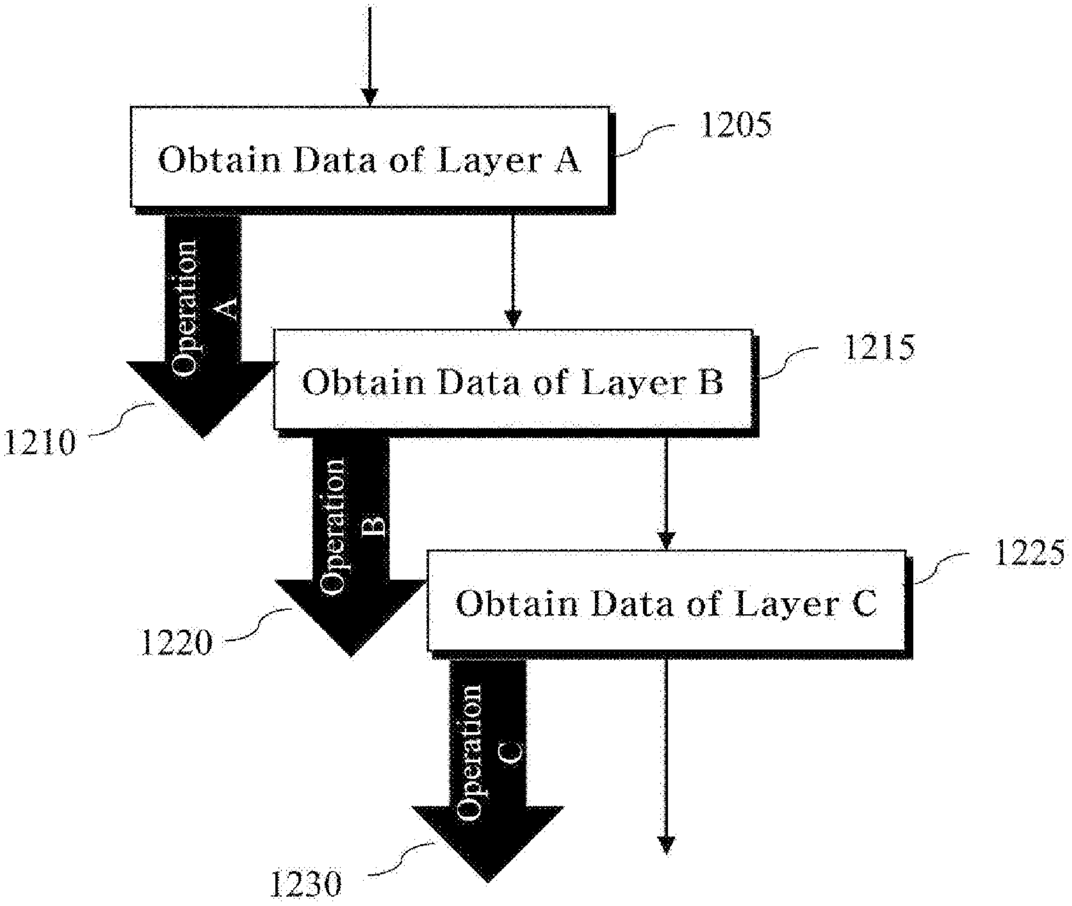
FIG. 12 is a diagram for describing a flow of an ANN processing method according to an embodiment of the present invention.

FIG. 12 shows a flow of a processing method according to an embodiment of the present invention. FIG. 12 is an implementation example of the above-described embodiments, and the present invention is not limited to the example of FIG. 12.

Referring to FIG. 12, a device for ANN processing (hereinafter, "device") obtains weights of layer A among a plurality of layers included in an ANN model from a memory-subsystem corresponding to a combination of a plurality of memories of different types (1205). The weights of layer A may be obtained from a first type memory of the memory-subsystem.

The device performs an operation on layer A based on the obtained weights of layer A (1210).

The device obtains weights of layer B of the ANN model from the memory-subsystem while the operation is performed on layer A (1215). The weights of layer B on which the operation is performed after layer A may be obtained from a second type memory of the memory-subsystem.

While the operation 1210 on layer A and the operation 1220 on layer B are performed, the device obtains weights of layer C of the ANN model from the memory-subsystem (1225). The weights of layer C on which the operation is performed after layer B may be obtained from a third type memory of the memory-subsystem.

Meanwhile, the device may include memories for read/write (R/W) of data related to the ANN model and at least one operation unit that performs operations regarding a plurality of layers included in the ANN model based on data. The memories may include at least one memory-subsystem corresponding to a combination of a plurality of memories of different types. Each operation unit may be configured to perform R/W of data through a memory-subsystem associated therewith among at least one memory-subsystem.

R/W for the weights of layer A of the ANN model may be performed through the first type memory of the associated memory-subsystem. R/W for the weights of layer B of the ANN model on which the operation is performed after layer A may be performed through the second type memory of the associated memory-subsystem. R/W for the weights of layer C of the ANN model on which the operation is performed after layer B may be performed through the third type memory of the associated memory-subsystem.

The read latency of the second type memory may be longer than the read latency of the first type memory and shorter than the read latency of the third type memory.

The processing time for layer A may be equal to or longer than the read latency of the second type memory. The sum of the processing time for layer A and the processing time for layer B may be equal to or greater than the read latency of the third type memory.

During the processing time of layer A, the weights of layer B may be prefetched from the second type memory. During the processing time of layer A and layer B, the weights of layer C may be prefetched from the third type memory.

Each memory-subsystem may be a combination of an SRAM, a DRAM and a NAND flash memory.

The SRAM may be coupled to each operation unit in an on-chip form.

A plurality of memories of different types within each memory-subsystem may have a hierarchical memory structure.

The memory located at the lowest level in the hierarchical memory structure may store weights for at least two deep neural network (DNN) models trained in advance through deep learning.

A memory type to be used for a corresponding layer may be determined based on a result of compiling the ANN model.

The device may be an accelerator that performs inference based on a previously trained deep neural network (DNN) model.

The device may be a data center on an Internet Protocol (IP) network that responds to inference requests from multiple users via a network interface card (NIC).

The above-described embodiments of the present invention may be implemented through various means. For example, embodiments of the present invention may be implemented by hardware, firmware, software, or a combination thereof.

In the case of implementation by hardware, the method according to embodiments of the present invention may be implemented by one or more of application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, and the like.

In the case of implementation by firmware or software, the method according to the embodiments of the present invention may be implemented in the form of a module, procedure, or function that performs the functions or operations described above. Software code may be stored in a memory unit and executed by a processor. The memory unit may be located inside or outside the processor and may transmit/receive data to/from the processor by various known means.

The detailed description of the preferred embodiments of the present invention described above has been provided to enable those skilled in the art to implement and practice the present invention. Although preferred embodiments of the present invention have been described, it will be understood by those skilled in the art that various modifications and changes can be made to the present invention without departing from the scope of the present invention. For example, those skilled in the art can use configurations described in the above-described embodiments by combining the configurations. Accordingly, the present invention is not intended to be limited to the embodiments described herein but is to be accorded the widest scope consistent with the principles and novel features disclosed herein.

The present information may be carried out in other specific ways than those set forth herein without departing from the spirit and essential characteristics of the present disclosure. The above embodiments are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein. In addition, claims that are not explicitly cited in the claims may be combined to form an embodiment or may be included as a new claim by amendment after filing.

What is claimed is:

1. A device for artificial neural network (ANN) processing, the device comprising:

a set of memories configured to read/write (R/W) data related to an ANN model; and operation units configured to perform operations regarding a plurality of layers included in the ANN model based on the data, wherein the set of memories comprises memory subsubsystems each including a combination of a plurality of memories, the plurality of memories being configured in a hierarchical structure, and storing weights of the ANN model, wherein each of the memory-subsystems is associated with each of the operation units, respectively, and wherein each operation unit is configured to perform R/W of the data through an associated memory-subsystem.

2. The device of claim 1, wherein:

R/W for weights of a first layer of the ANN model is performed through a first level memory in the hierarchical structure of the associated memory-subsystem, R/W for weights of a second layer of the ANN model, on which an operation is performed after the first layer, is performed through a second level memory in the hierarchical structure of the associated memory-subsystem, and R/W for weights of a third layer of the ANN model, on which an operation is performed after the second layer, is performed through a third level memory in the hierarchical structure of the associated memory-subsystem.

3. The device of claim 2, wherein a processing time for the first layer is equal to or longer than the read latency of the second level memory, and wherein a sum of the processing time for the first layer and a processing time for the second layer is equal to or greater than the read latency of the third level memory.

4. The device of claim 2, wherein the weights of the second layer are prefetched from the second level memory during the processing time of the first layer, and wherein the weights of the third layer are prefetched from the third level memory during the processing times of the first layer and the second layer.

5. The device of claim 2, wherein a read latency of the second level memory is longer than a read latency of the first level memory and shorter than a read latency of the third level memory.

6. The device of claim 1, wherein each memory-subsystem includes a combination of a static random access memory (SRAM), a dynamic random access memory (DRAM), and a Not AND (NAND) flash memory.

7. The device of claim 6, wherein the SRAM is coupled to an associated operation unit in an on-chip form.

8. The device of claim 1, wherein a memory at a lowest level in the hierarchical structure stores weights for at least two deep neural network (DNN) models.

9. The device of claim 1, wherein a memory to be used for a corresponding layer among the plurality of memories in the hierarchical structure, is determined based on a result of compiling the ANN model.

10. The device of claim 1, wherein the device is an accelerator configured to perform inference based on a previously trained deep neural network (DNN) model.

11. The device of claim 1, wherein the device is a data center on an Internet protocol (IP) network, configured to respond to inference requests from multiple users via a network interface card (NIC).

12. The device of claim 1, wherein the plurality of memories in the hierarchical structure are related to different types of memories, respectively.

13. A method of artificial neural network (ANN) processing, the method comprising:

storing weights of a plurality of layers of an ANN model, to a memory-subsystem including a combination of a plurality of memories, the plurality of memories being configured in a hierarchical structure;

obtaining first weights of a first layer of the ANN model based on the weights stored in the memory-subsystem;

performing an operation on the first layer based on the first weights of the first layer;

obtaining second weights of a second layer of the ANN model based on the weights stored in the memory-subsystem while the operation is performed on the first layer; and obtaining third weights of a third layer of the ANN model based on the weights stored in the memory-subsystem while the operation on the first layer and the operation on the second layer are performed, wherein the first weights of the first layer are obtained from a first level memory in the hierarchical structure, the second weights of the second layer are obtained from a second level memory in the hierarchical structure, and the third weights of the third layer are obtained from a third level memory in the hierarchical structure.

14. The method of claim 13, wherein the plurality of memories in the hierarchical structure are related to different types of memories, respectively.

15. The method of claim 14, wherein the different types of memories comprise a static random access memory (SRAM), a dynamic random access memory (DRAM), and a Not AND (NAND) flash memory.

16. The method of claim 14, wherein the different types of memories have different read latencies, respectively.

17. A non-transitory processor-readable medium storing instructions that, when executed by at least one processor of a device, that cause the device to perform operations, the operations comprising:

storing weights of a plurality of layers of an ANN model, to a memory-subsystem including a combination of a plurality of memories, the plurality of memories being configured in a hierarchical structure;

obtaining first weights of a first layer of the ANN model based on the weights stored in the memory-subsystem;

performing an operation on the first layer based on the first weights of the first layer;

obtaining second weights of a second layer of the ANN model based on the weights stored in the memory-subsystem while the operation is performed on the first layer; and obtaining third weights of a third layer of the ANN model based on the weights stored in the memory-subsystem while the operation on the first layer and the operation on the second layer are performed, wherein the first weights of the first layer are obtained from a first level memory in the hierarchical structure, the second weights of the second layer are obtained from a second level memory in the hierarchical structure, and the third weights of the third layer are obtained from a third level memory in the hierarchical structure.

* * * * *